US008040172B2

(12) United States Patent
Jerabek et al.

(10) Patent No.: US 8,040,172 B2
(45) Date of Patent: Oct. 18, 2011

(54) LOGIC LEVEL CONVERTER

(75) Inventors: Tomas Jerabek, Celakovice (CZ); Karel Napravnik, Prague (CZ)

(73) Assignee: STMicroelectronics Design and Application s.r.o., Prague (CZ)

( * ) Notice: Subject to any disclaimer, the term of this patent is extended or adjusted under 35 U.S.C. 154(b) by 0 days.

(21) Appl. No.: 12/621,380

(22) Filed: Nov. 18, 2009

(65) Prior Publication Data

US 2010/0156499 A1    Jun. 24, 2010

(30) Foreign Application Priority Data

Dec. 23, 2008 (IT) .............................. TO2008A0977

(51) Int. Cl.
*H03H 11/16* (2006.01)
(52) U.S. Cl. ........................................ 327/231; 327/333
(58) Field of Classification Search .................. None
See application file for complete search history.

(56) References Cited

U.S. PATENT DOCUMENTS

| | | | |
|---|---|---|---|
| 5,793,245 A * | 8/1998 | Marshall et al. | ............... 327/389 |
| 5,821,800 A | 10/1998 | Le et al. | |
| 5,963,054 A | 10/1999 | Cochran et al. | |
| 5,995,010 A | 11/1999 | Blake et al. | |
| 6,236,244 B1 * | 5/2001 | Depetro et al. | ............... 327/108 |
| 7,714,613 B2 * | 5/2010 | Mori | .............................. 326/63 |
| 2004/0150454 A1 | 8/2004 | Bhattacharya et al. | |
| 2006/0208759 A1 | 9/2006 | Nojiri | |

FOREIGN PATENT DOCUMENTS

WO    WO9732399 A    9/1997

OTHER PUBLICATIONS

Italian Patent Office Written Opinion; Italy Application No. TO20080977, May 4, 2009, 8 pages.

* cited by examiner

*Primary Examiner* — Cassandra Cox
(74) *Attorney, Agent, or Firm* — William J. Kubida; Peter J. Meza; Hogan Lovells US LLP

(57) ABSTRACT

A logic level converter includes two first electronic switches coupled in a bi-stable flip-flop arrangement having at least one output line, and a forcing circuitry including two second electronic switches to force switching of the first electronic switches in the flip-flop arrangement. The forcing circuitry has an input terminal to receive a logic input signal having a given level to produce switching of the flip-flop arrangement and generate at the output line(s) of the flip-flop arrangement, a logic output signal(s) whose voltage level is converted with respect to the level of the logic input signal. The converter includes, interposed between each of the two first electronic switches in the flip-flop arrangement and a respective one of the second electronic switches in the forcing circuitry, at least one respective cascode electronic switch to limit the voltage across the two first electronic switches in the flip-flop arrangement.

31 Claims, 2 Drawing Sheets

LOGIC LEVEL CONVERTER

RELATED APPLICATION

The present application claims priority of Italian Patent Application No. TO2008A000977 filed Dec. 23, 2008, which is incorporated herein in its entirety by this reference.

FIELD OF THE INVENTION

This disclosure relates to logic level converters. Such converters are used in a wide variety of applications in electronics, e.g. to enable connection of different logic domains.

DESCRIPTION OF THE RELATED ART

In modern logic systems, e.g. for logical signal processing, more than one voltage domain may be used. For instance, while "core" logic blocks may be powered by an internal voltage in a device, logic output signals driving destination blocks may have to adjust their voltage levels to the levels used by each respective destination block. Thus, one or more converter circuits may be used to convert the logical signals from one voltage domain to the other by scaling upward or downward the voltage level of these signals.

FIG. 1 herein is a circuit diagram representative of a conventional logic level converter. The core of arrangement shown in FIG. 1 is a bi-stable flip-flop comprised of two electronic switches (e.g. transistors such as MOSFETs) M2 and M3, powered by the supply voltage VDD of the destination circuit. The state of the flip-flop circuit can be forced by two electronic switches (again, e.g. transistors such as MOSFETs) M0 and M1, acting as set and reset signals for the flip-flop stage, having interposed therebetween a logical inverter I.

If a "high" signal is applied at the input IN (corresponding to the gate of the transistor M0 and the input of inverter I) at a level V1 (in a first logic domain) enough to make M0 conductive, M1 will be cut-off and thus the output OUT1 will be a "high" level substantially equal to VDD (thus representing a "high" signal converted in the logic domain of the destination circuit).

SUMMARY OF THE INVENTION

The inventors have noted that an intrinsic limitation of the above-described conventional solution lies in impossibility to apply voltages higher than the maximum break-down voltage for given technology (Vbreak). An object of the invention is thus to provide an arrangement dispensing with that limitation.

According to the present invention, such an object is achieved by means of an apparatus having the features set forth in the claims that follow. A preferred embodiment of a logic level converter of the present invention includes two first electronic switches coupled in a bi-stable flip-flop arrangement having at least one output line; forcing circuitry including two second electronic switches to force switching of said two first electronic switches in said flip-flop arrangement, said forcing circuitry having an input terminal to receive a logic input signal having at least one level to produce switching of said flip-flop arrangement and generate at said at least one output line, a logic output signal having at least one level converted with respect to said at least one level of said logic input signal; and at least one respective cascode electronic switch interposed between each of said two first electronic switches in said flip-flop arrangement and a respective one of said two second electronic switches in said forcing circuitry, wherein said at least one respective cascode electronic switch limits the voltage across said two first electronic switches in said flip-flop arrangement.

Other embodiments of the present invention are encompassed by the dependent claims, it being understood that the claims are an integral part of the disclosure of the invention provided herein.

An embodiment of the arrangement described herein is a logic level converter which enables connection of two logic level domains, drives no static current and is able to sustain twice the breakdown voltage of the transistor technology used for the converter.

Preferably, an embodiment of the arrangement described herein does not contain any special devices such as drift MOSes. Also, an embodiment of the present invention has the advantage that it does not drive any static current, has double voltage sustainability over technology break-down voltage while making it possible to employ several techniques for transient response improvement.

BRIEF DESCRIPTION OF THE DRAWINGS

The invention will now be described, by way of example only, with reference to the enclosed views, wherein.

DETAILED DESCRIPTION OF PREFERRED EMBODIMENTS

In the following description, numerous specific details are given to provide a thorough understanding of embodiments. The embodiments can be practiced without one or more of the specific details, or with other methods, components, materials, etc. In other instances, well-known structures, materials, or operations are not shown or described in detail to avoid obscuring aspects of the embodiments. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

Figure 1:
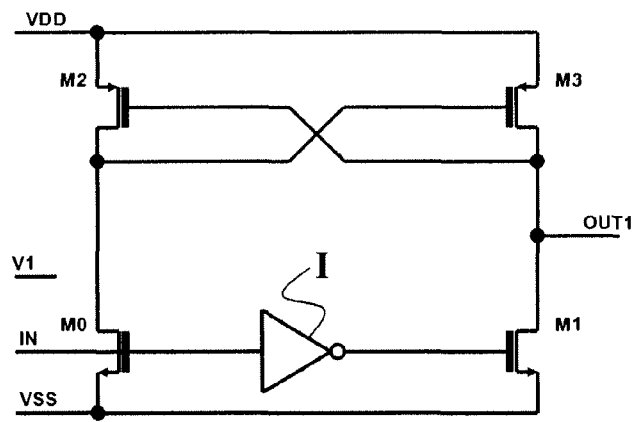
FIG. 1 is a circuit diagram representative of a conventional logic level converter.

The embodiment described herein is a proposed modification of the general layout of a logic level converter as illustrated in FIG. 1. Consequently, the detailed description of the embodiment described herein will not repeat those elements that are common with the arrangement of FIG. 1. It will be otherwise understood that components/elements that are identical or equivalent are indicated with the same references throughout the views annexed herein.

Also, it will be appreciated that the embodiments disclosed herein are applicable to any logic level converter including:
two first electronic switches coupled in a bi-stable flip-flop arrangement having at least one output line, and
a forcing circuitry including two second electronic switches to force switching of said two first electronic switches in said flip-flop arrangement, said forcing circuitry having an input terminal to receive a logic input signal having at least one level to produce switching of said flip-flop arrangement and generate at said at least one output line a logic output signal having at least one level converted with respect to said at least one level of said logic input signal.

Reference to the specific constructional details illustrated in the views is thus for exemplary and non-limiting purposes.

Figure 2:
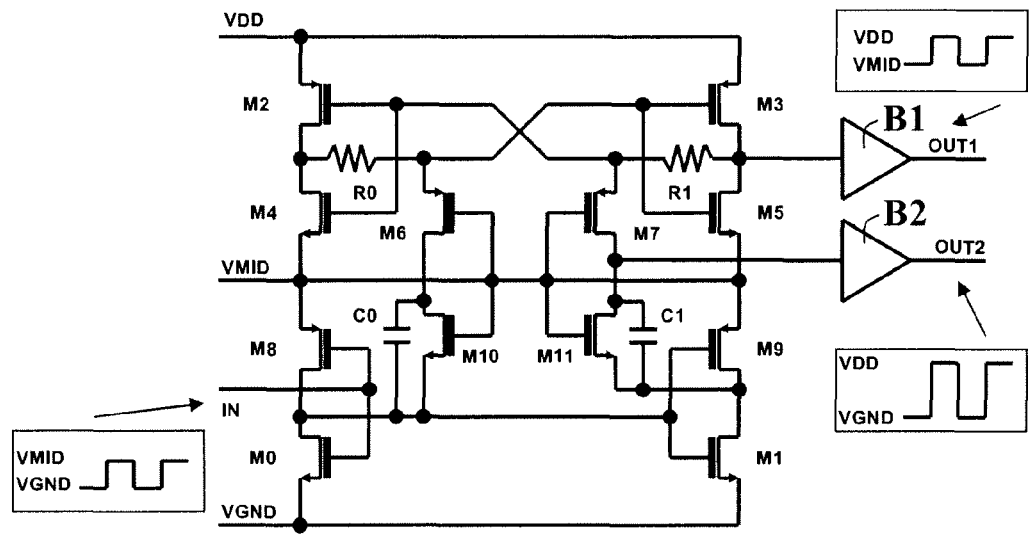
FIGS. 2 and 3 are representative of embodiments of the present invention.

In FIG. 2 a positive voltage version of a logic level converter is presented, i.e. a version where VDD and VMID are positive voltages (VDD>VMID>VGND, with e.g. VGND=0).

Figure 3:
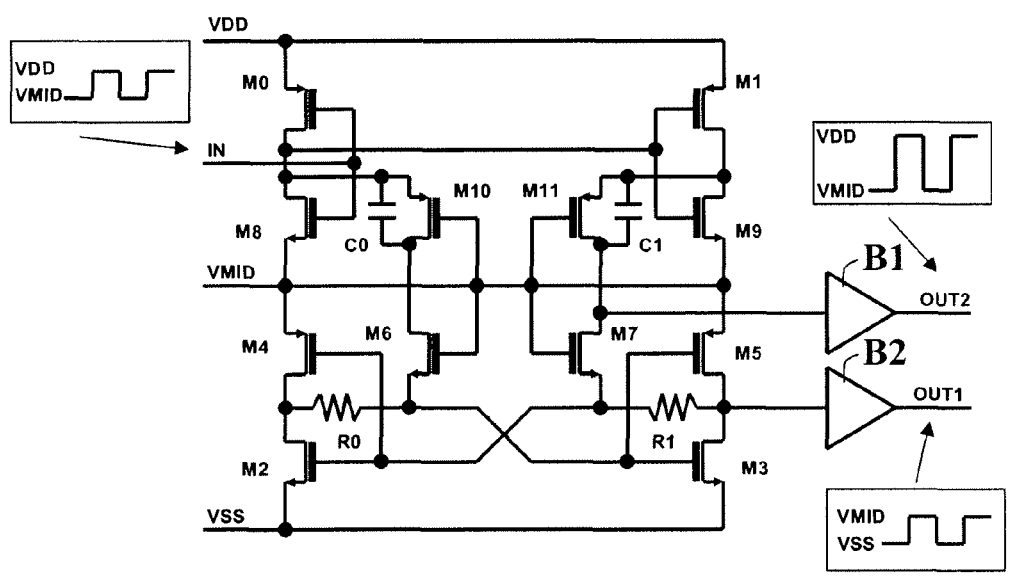

Conversely, in FIG. 3 a negative voltage version of logic level converter is presented, i.e. a version where VSS is a negative voltage.

In both cases, the voltage between VDD and VGND (VSS respectively) can be up to 2*Vbreak, where Vbreak denotes the breakdown voltage of the transistor technology used for the converter (here MOSFET, even though other technologies such as e.g. bipolar may also be used). The designations "source", "gate" and "drain", as used herein (including the claims) in connection with FET technology are to be understood as comprehensive of the designations "emitter", "base" and "collector" when referred to bipolar technology.

Structure and operation of the "positive voltage" embodiment of FIG. 2 will now be described.

Comparison of FIGS. 2 and 3 will otherwise show that the embodiment of FIG. 3 is essentially the same circuit of FIG. 2 turned "upside down" (with e.g., the transistors M2 and M3 appearing at the top of the embodiment of FIG. 2 located at the bottom in the embodiment of FIG. 3 and, vice versa, the transistors M0 and M1 appearing at the bottom of the embodiment of FIG. 2 located at the top in the embodiment of FIG. 3). Also, comparison of FIGS. 2 and 3 will show that where the embodiment of FIG. 2 includes a p-channel MOS, the embodiment of FIG. 3 includes a homologous MOS of the re-channel type and vice-versa.

In the embodiment of FIG. 2, the input logic levels to the "forcing" circuitry are (at least) VMID for "1" (or "high") and VGND for "0" (or "low").

Two types of output signals are available at the output of the flip-flop, namely:
  OUT1, with a lower swing, i.e. "1" or "high" equal to VDD and "0" or "low" equal to VMID, and
  OUT2, with full swing, i.e. "1" or "high" equal to VDD and "0" or "low" equal to VGND.

The core of the circuit is again the bi-stable flip-flop comprised of the transistors M2 and M3.

Two transistors M6 and M7 acting as protective cascodes are connected as voltage followers with their gates on VMID, limiting the voltage on their sources in order to protect the bistable flip-flop from exposition to higher voltage.

Resistors R0 and R1 are interposed in the crossed paths of the flip-flop arrangement, i.e. the paths connecting the gate of either of M2 resp. M3 to the drain of the "opposed" transistor, i.e. M3 resp. M2, in the flip-flop arrangement. The transistors M6 and M7 have their respective sources connected to the crossed paths of the flip-flop arrangement between R0 resp. R1 and the gate of M3 resp. M2.

When either of M2 or M3 is switched on (i.e. made conductive), a transient current arises which induces a voltage drop on R0 or R1, respectively, thus increasing the gate-source voltage Vgs of the associated transistor. This makes flip-flop switching faster while also reducing (if not dispensing at all) switching current losses.

The transistors M4 and M5, having their source-drain lines interposed between the drains of M2 and M3 and the line VMID, help to define the logical state at the drains of M2 or M3 by "clamping" VMID at either of "1" or "0", respectively.

The "forcing" part again includes the two transistors M0 and M1, having their sources connected to VGND (or VDD) and their drains connected to the drains of two other transistors M8, M9 having their sources connected to VMID.

The "forcing" part of the embodiment thus includes a first input inverter comprised of M0 and M8 and a second input inverter comprised of M1 and M9.

Again, two cascodes M10 and M11 with their gates connected to VMID, their sources connected to the input IN and their drains connected to the drains of M6 and M7, protect the inverters from undue exposition to higher voltages.

In order to limit switching overshoots on internal nets, capacitors C0 and C1 are employed connected across the source-drain lines of M10 and M11.

This embodiment is advantageous in periodically switched systems, such as e.g. charge pumps, as it permits safe transient operation close to desired 2*Vbreak supply.

In the embodiments illustrated, buffers B1, B2 are associated to the outputs OUT1, OUT2 (taken at the common drains of M3, M5 and M7, M11) in order to separate the load influence of destination circuits.

As indicated, the "negative" embodiment of FIG. 3 is structurally identical to the "positive" embodiment of FIG. 2. In the "negative" embodiment of FIG. 3, the input logic levels are VDD for "1" or "high" and VMID for "0" or "low". Again, two types of output signals can be used, namely:
  OUT1, with a lower swing, i.e. "1" or "high" equal to VMID and "0" or "low" equal to VSS, and
  OUT2, with full swing, i.e. "1" or "high" equal to VDD and "0" or "low" equal to VSS.

In certain "negative" embodiments, it is possible to advantageously use VGND to supply VMID, provided (VMID-VSS) is still lower than Vbreak.

Without prejudice to the underlying principles of the invention, the details and the embodiments may vary, even appreciably, with respect to what has been described by way of example only, without departing from the scope of the invention as defined by the annexed claims.

The invention claimed is:

1. A logic level converter comprising:
  two first electronic switches coupled in a bi-stable flip-flop arrangement having at least one output line;
  a forcing circuitry including two second electronic switches to force switching of said two first electronic switches in said flip-flop arrangement, said forcing circuitry having an input terminal to receive a logic input signal having at least one level to produce switching of said flip-flop arrangement and generate at said at least one output line, a logic output signal having at least one level converted with respect to said at least one level of said logic input signal; and
  at least one respective cascode electronic switch interposed between each of said two first electronic switches in said flip-flop arrangement and a respective one of said two second electronic switches in said forcing circuitry, wherein said at least one respective cascode electronic switch limits the voltage across said two first electronic switches in said flip-flop arrangement,
  wherein said two first electronic switches are coupled via crossed coupling paths coupling the gates of each of said two first electronic switches to a source-drain line of the other of said two first electronic switches in said flip-flop arrangement, and wherein respective resistors are interposed in said crossed paths of the flip-flop arrangement, to increase the gate-source voltage of said two first electronic switches during switching transients.

2. The logic level converter of claim 1, wherein said cascode electronic switches are coupled to said crossed paths.

3. The logic level converter of claim 1, wherein said cascode electronic switches are coupled to said crossed paths between said respective resistors and the gates of said two first electronic switches.

4. The logic level converter of claim 1 further comprising:
clamping electronic switches interposed between said two first electronic switches and a line at a selectively predetermined voltage level and actuatable to clamp the logical state at the drains of said two first electronic switches at a selectively predetermined voltage level.

5. The logic level converter of claim 1 further comprising:
a first said output line at one of said two first electronic switches; and
a second said output line at one of said cascode electronic switches.

6. The logic level converter of claim 1 further comprising:
buffer circuitry at said at least one output line.

7. The logic level converter of claim 1, wherein said forcing circuitry comprises a first input inverter and a second input inverter.

8. The logic level converter of claim 7, wherein said first and second input inverters each include a cascaded arrangement of one of said two second electronic switches and an associated electronic switch coupled to a line at a selectively predetermined voltage level.

9. The logic level converter of claim 1, wherein said forcing circuitry further comprises forcing cascode electronic switches.

10. The logic level converter of claim 9, wherein said forcing cascode electronic switches have capacitors coupled across source-drain lines thereof to limit switching overshoots.

11. A logic level converter comprising:
two first electronic switches coupled in a bi-stable flip-flop arrangement having at least one output line;
a forcing circuitry including two second electronic switches to force switching of said two first electronic switches in said flip-flop arrangement, said forcing circuitry having an input terminal to receive a logic input signal having at least one level to produce switching of said flip-flop arrangement and generate at said at least one output line, a logic output signal having at least one level converted with respect to said at least one level of said logic input signal;
at least one respective cascode electronic switch interposed between each of said two first electronic switches in said flip-flop arrangement and a respective one of said two second electronic switches in said forcing circuitry, wherein said at least one respective cascode electronic switch limits the voltage across said two first electronic switches in said flip-flop arrangement; and
clamping electronic switches interposed between said two first electronic switches and a line at a selectively predetermined voltage level and actuatable to clamp the logical state at the drains of said two first electronic switches at a selectively predetermined voltage level.

12. The logic level converter of claim 11, wherein said two first electronic switches are coupled via crossed coupling paths coupling the gates of each of said two first electronic switches to a source-drain line of the other of said two first electronic switches in said flip-flop arrangement.

13. The logic level converter of claim 12, wherein said cascode electronic switches are coupled to said crossed paths.

14. The logic level converter of claim 12, wherein respective resistors are interposed in said crossed paths of the flip-flop arrangement, to increase the gate-source voltage of said two first electronic switches during switching transients.

15. The logic level converter of claim 14, wherein said cascode electronic switches are coupled to said crossed paths between said respective resistors and the gates of said two first electronic switches.

16. The logic level converter of claim 11 further comprising:
a first said output line at one of said two first electronic switches; and
a second said output line at one of said cascode electronic switches.

17. The logic level converter of claim 11 further comprising:
buffer circuitry at said at least one output line.

18. The logic level converter of claim 11, wherein said forcing circuitry comprises a first input inverter and a second input inverter.

19. The logic level converter of claim 18, wherein said first and second input inverters each include a cascaded arrangement of one of said two second electronic switches and an associated electronic switch coupled to a line at a selectively predetermined voltage level.

20. The logic level converter of claim 11, wherein said forcing circuitry further comprises forcing cascode electronic switches.

21. The logic level converter of claim 20, wherein said forcing cascode electronic switches have capacitors coupled across source-drain lines thereof to limit switching overshoots.

22. A logic level converter comprising:
two first electronic switches coupled in a bi-stable flip-flop arrangement having at least one output line;
a forcing circuitry including two second electronic switches to force switching of said two first electronic switches in said flip-flop arrangement, said forcing circuitry having an input terminal to receive a logic input signal having at least one level to produce switching of said flip-flop arrangement and generate at said at least one output line, a logic output signal having at least one level converted with respect to said at least one level of said logic input signal; and
at least one respective cascode electronic switch interposed between each of said two first electronic switches in said flip-flop arrangement and a respective one of said two second electronic switches in said forcing circuitry, wherein said at least one respective cascode electronic switch limits the voltage across said two first electronic switches in said flip-flop arrangement,
wherein said forcing circuitry further comprises forcing cascode electronic switches, and
wherein said forcing cascode electronic switches have capacitors coupled across source-drain lines thereof to limit switching overshoots.

23. The logic level converter of claim 22, wherein said two first electronic switches are coupled via crossed coupling paths coupling the gates of each of said two first electronic switches to a source-drain line of the other of said two first electronic switches in said flip-flop arrangement.

24. The logic level converter of claim 23, wherein said cascode electronic switches are coupled to said crossed paths.

25. The logic level converter of claim 23, wherein respective resistors are interposed in said crossed paths of the flip-flop arrangement, to increase the gate-source voltage of said two first electronic switches during switching transients.

26. The logic level converter of claim 25, wherein said cascode electronic switches are coupled to said crossed paths between said respective resistors and the gates of said two first electronic switches.

27. The logic level converter of claim 22 further comprising:
clamping electronic switches interposed between said two first electronic switches and a line at a selectively predetermined voltage level and actuatable to clamp the logical state at the drains of said two first electronic switches at a selectively predetermined voltage level.

28. The logic level converter of claim 22 further comprising:
a first said output line at one of said two first electronic switches; and
a second said output line at one of said cascode electronic switches.

29. The logic level converter of claim 22 further comprising:
buffer circuitry at said at least one output line.

30. The logic level converter of claim 22, wherein said forcing circuitry comprises a first input inverter and a second input inverter.

31. The logic level converter of claim 30, wherein said first and second input inverters each include a cascaded arrangement of one of said two second electronic switches and an associated electronic switch coupled to a line at a selectively predetermined voltage level.

* * * * *